(12) United States Patent
Endo et al.

(10) Patent No.: US 7,595,142 B2
(45) Date of Patent: Sep. 29, 2009

(54) PATTERN FORMATION METHOD

(75) Inventors: Masayuki Endo, Osaka (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 575 days.

(21) Appl. No.: 11/430,993

(22) Filed: May 10, 2006

(65) Prior Publication Data

US 2006/0275707 A1 Dec. 7, 2006

(30) Foreign Application Priority Data

Jun. 3, 2005 (JP) .............................. 2005-163992

(51) Int. Cl.
*G03F 7/26* (2006.01)
(52) U.S. Cl. ...................................... 430/311; 430/961
(58) Field of Classification Search ................. 430/311, 430/322, 961
See application file for complete search history.

(56) References Cited

U.S. PATENT DOCUMENTS

| 2004/0075895 | A1 | 4/2004 | Lin |
| 2005/0069819 | A1 | 3/2005 | Shiobara |
| 2008/0299503 | A1* | 12/2008 | Ishiduka et al. ............. 430/325 |
| 2009/0011375 | A1* | 1/2009 | Hirayama et al. ........... 430/325 |

OTHER PUBLICATIONS

M. Switkes, et al. "Immersion lithography at 157 nm," J. Vac. Sci. Technol., Nov./Dec. 2001, pp. 2353-2356, vol. B 19, No. 6, American Society.
Bruce W. Smith, et al., "Approaching the numerical aperture of water—Immersion lithography at 193 nm," Optical Microlithography XVII, Proceedings of SPIE, 2004, pp. 273-284, vol. 5377.
Extended European Search Report issued in corresponding European Patent Application No. EP 06 00 6439, dated Oct. 31, 2006.
Dammel, et al., "193 nm Immersion Lithography-Taking the Plunge," Journal of Photopolymer Science and Technology, 2004, pp. 587-602, vol. 17, No. 4.
Chen, et al., "Characterization of ArF immersion process for production," Proceedings of the SPIE, 2005, pp. 13-22, vol. 5754, No. 1, SPIE, Bellingham, WA.

\* cited by examiner

*Primary Examiner*—Kathleen Duda
(74) *Attorney, Agent, or Firm*—McDermott Will & Emery LLP

(57) ABSTRACT

In a pattern formation method, a resist film is formed on a substrate, an alkali-soluble first barrier film is formed on the resist film and an alkali-insoluble second barrier film is formed on the first barrier film. Subsequently, with a liquid provided on the second barrier film, pattern exposure is performed by selectively irradiating the resist film with exposing light through the second barrier film and the first barrier film. Then, after removing the second barrier film, the resist film having been subjected to the pattern exposure is developed, so as to remove the first barrier film and form a resist pattern made of the resist film.

30 Claims, 10 Drawing Sheets

PATTERN FORMATION METHOD

CROSS-REFERENCE TO RELATED APPLICATIONS

This application claims priority under 35 U.S.C. §119 on Patent Application No. 2005-163992 filed in Japan on Jun. 3, 2005, the entire contents of which are hereby incorporated by reference.

BACKGROUND OF THE INVENTION

The present invention relates to a pattern formation method for use in fabrication process or the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength of 157 nm is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n (whereas n>1) and therefore, the NA (numerical aperture) of the exposure system has a value n·NA. As a result, the resolution of the resist film can be improved.

Also, in order to increase the refractive index, use of an acidic solution as the immersion liquid has been proposed (see, for example, B. W. Smith, A. Bourov, Y. Fan, L. Zavyalova, N. Lafferty, F. Cropanese, "Approaching the numerical aperture of water—Immersion Lithography at 193 nm", Proc. SPIE, Vol. 5377, p. 273 (2004)).

Now, a conventional pattern formation method employing the immersion lithography will be described with reference to FIGS. 9A through 9D, 10A and 10B.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.04 g Quencher: triethanolamine . . . 0.002 g Solvent: propylene glycol monomethyl ether acetate . . . 20 g Next, as shown in FIG. 9A, the aforementioned chemically amplified resist material is applied on a substrate 1 so as to form a resist film 2 with a thickness of 0.35 µm.

Then, as shown in FIG. 9B, a barrier film 3 having a thickness of 50 nm and made of an alkali-soluble barrier film material having the following composition is formed on the resist film 2 by, for example, spin coating:

Base polymer: polyvinyl alcohol . . . 1 g

Solvent: n-propyl alcohol . . . 25 g

Next, as shown in FIG. 9C, the resultant barrier film 3 is baked with a hot plate at a temperature of 120° C. for 90 seconds.

Then, as shown in FIG. 9D, with water 4, that is, an immersion liquid, provided on the barrier film 3, pattern exposure is carried out by irradiating the resist film 2 through the water 4 and the barrier film 3 with exposing light 5 of ArF excimer laser having NA of 0.68 having passed through a mask 6.

After the pattern exposure, as shown in FIG. 10A, the resist film 2 is baked with a hot plate at a temperature of 105° C. for 60 seconds, and thereafter, the resultant resist film 2 is developed with a 2.38 wt % tetramethylammonium hydroxide developer. In this manner, a resist pattern 2a made of an unexposed portion of the resist film 2 and having a line width of 0.09 µm is formed as shown in FIG. 10B.

However, as shown in FIG. 10B, the resist pattern 2a obtained by the conventional pattern formation method is in a defective shape. Furthermore, residues 2b are produced.

SUMMARY OF THE INVENTION

The present inventors have variously examined the reason why the resist pattern 2a formed by the conventional immersion lithography is in a defective shape, resulting in finding the following: The barrier property of the barrier film 3 against the water 4 used as the immersion liquid is not sufficient, and hence, interference caused between a composing element of the resist film 2 made of the chemically amplified resist material and the water 4 provided on the barrier film 3 results in the defective shape of the resist pattern 2a. The interference between the resist component and the water includes elution of the acid generator, the quencher or the like included in the resist into the water 4 and permeation of the water 4 into the resist film 2 through the barrier film 3. Due to the interference, the performance required of the resist itself cannot be attained. For example, in the case of FIG. 10B, the concentration of the acid generator seems to be lowered on the interface between an exposed portion and the unexposed portion of the resist film 2, and therefore, the resultant resist pattern 2a is formed in a defective shape with a T-top portion. On the contrary, in the case where the concentration of the quencher for deactivating an acid generated through the exposure is lowered on the interface, the resist pattern 2a is formed in a defective shape with round shoulders.

In either case, when the resist pattern 2a in such a defective shape is used for etching a target film, the resultant pattern of the target film is also in a defective shape, which disadvantageously lowers the productivity and the yield in the fabrication process for semiconductor devices.

In consideration of the aforementioned conventional problem, an object of the invention is forming a fine pattern in a good shape by preventing the influence of an immersion liquid used in the immersion lithography on a resist film.

The present inventors have found that when an alkali-soluble first barrier film is covered with an alkali-insoluble second barrier film, the barrier property of the first barrier film against an immersion liquid can be improved. When the alkali-insoluble second barrier film is thus provided on the alkali-soluble first barrier film, since the alkali-insoluble second barrier film has very low solubility also in an aqueous solution, a resist film is sufficiently blocked from an aqueous solution used as the immersion liquid. Specifically, the second barrier film can prevent the immersion liquid from permeating into the resist film or a composing element of the resist film from eluting into the immersion liquid.

In addition, since the alkali-soluble first barrier film is provided between the alkali-insoluble second barrier film and the resist film, the second barrier film is not in direct contact with the resist film. When the alkali-insoluble second barrier film is in direct contact with the resist film, there may arise a problem, for example, that the pattern formation through exposure cannot be smoothly performed. This is because a polymer included in the alkali-insoluble second barrier film interacts with and mixes with a polymer skeleton included in the resist film having a hydroxyl group or a carboxyl group. On the contrary, when the alkali-soluble first barrier film is disposed between the second barrier film and the resist film as in this invention, a hydroxyl group or the like is substituted in a polymer included in the alkali-soluble first barrier film, and hence, the first barrier film mixes neither with the resist film disposed beneath it nor with the alkali-insoluble second barrier film disposed on it. In other words, the surface of the resist film is protected by the alkali-soluble first barrier film, resulting in preventing the surface of the resist film from being roughened by the second barrier film. Also, since the first barrier film is alkali-soluble, it can be easily removed from above the resist film in development, and pattern failure and occurrence of defects of a target film caused by the pattern failure can be prevented.

As described so far, the present inventors have found that a two-layered barrier structure composed of the alkali-soluble first barrier film and the alkali-insoluble second barrier film stacked on it has a high barrier property. Specifically, while keeping removability of the barrier film itself by the alkali-soluble first barrier film, the elution of a composing element of a resist film into an immersion liquid and the permeation of the immersion liquid into the resist film can be sufficiently prevented.

The present invention was devised on the basis of the aforementioned finding, so that the barrier film formed on the resist film can allow the resist film to keep the desired performance. Specifically, the invention is practiced as follows:

The first pattern formation method of this invention includes the steps of forming a resist film on a substrate; forming an alkali-soluble first barrier film on the resist film; forming an alkali-insoluble second barrier film on the first barrier film; performing pattern exposure by selectively irradiating the resist film with exposing light through the second barrier film and the first barrier film with a liquid provided on the second barrier film; removing the second barrier film; and removing the first barrier film and forming a resist pattern made of the resist film by developing the resist film after the pattern exposure.

The second pattern formation method of this invention includes the steps of forming a resist film on a substrate; forming an alkali-soluble first barrier film on the resist film; forming an alkali-insoluble second barrier film on the first barrier film; performing pattern exposure by selectively irradiating the resist film with exposing light through the second barrier film and the first barrier film with a liquid provided on the second barrier film; removing the second barrier film; removing the first barrier film; and forming a resist pattern made of the resist film by developing the resist film after the pattern exposure and after removing the first barrier film.

The third pattern formation method of this invention includes the steps of forming a resist film on a substrate; forming an alkali-soluble first barrier film on the resist film; forming an alkali-insoluble second barrier film on the first barrier film; performing pattern exposure by selectively irradiating the resist film with exposing light through the second barrier film and the first barrier film with a liquid provided on the second barrier film; removing the first barrier film, thereby simultaneously removing the second barrier film; and forming a resist pattern made of the resist film by developing the resist film after the pattern exposure.

In each of the first through third pattern formation methods of the invention, after forming the alkali-soluble first barrier film on the resist film, the alkali-insoluble second barrier film is formed on the first barrier film. As described with respect to the aforementioned finding, the alkali-insoluble second barrier film has very low solubility also in an aqueous solution, and hence, when water or an aqueous solution is used as the immersion liquid, the barrier property of the first barrier film and the second barrier film against the water or the like is improved. Therefore, the influence of the immersion liquid on the resist film is prevented, resulting in forming a fine pattern in a good shape.

In the first pattern formation method, after removing the second barrier film alone, the first barrier film is removed simultaneously with the development. In the second pattern formation method, the second barrier film is removed and the first barrier film is removed, and then, the resist film having been subjected to the pattern exposure is developed. In the third pattern formation method, the alkali-soluble first barrier film is removed before the development, so as to remove the alkali-insoluble second barrier film provided on the first barrier film by a function similar to the lift-off function of the first barrier film.

In this manner, in each pattern formation method of this invention, the first barrier film may be removed during or before the development, and both have their advantages as follows: When the first barrier film is removed during the development of the resist film as in the first pattern formation method, the dissolution characteristic of the resist film can be advantageously controlled to be improved. In other words, when the first barrier film is removed simultaneously with the development, the dissolution characteristic of the resist film can be controlled to given extent.

On the other hand, when the first barrier film is removed before the development as in the second or third pattern formation method, the following development can be smoothly performed.

Now, the dissolution characteristic of a resist film will be described with reference to FIG. 11. In general, when the dissolution characteristic of a resist film is high, the dissolution rate is abruptly increased when exposure exceeds a given threshold value (a threshold region of FIG. 11) (as shown with a graph A of a broken line in FIG. 11). As the change of the dissolution rate against the exposure is more abrupt, a difference in the solubility between an exposed portion and an unexposed portion of the resist film is larger, and hence, the resist pattern can be more easily formed in a good shape. Accordingly, in the case where the barrier film is removed during the development, the dissolution rate is wholly lowered correspondingly to the removal of the barrier film, and hence, the change in a portion surrounded with a circle C in FIG. 11 can be reduced to be flatter. As a result, in the case where the actual resist film has the dissolution characteristic as shown with a graph B, the dissolution rate attained with smaller exposure can be adjusted to be comparatively constant at a low dissolution rate even when the small exposure varies to some extent. Accordingly, a difference in the solubility between an exposed portion and an unexposed portion of the resist film can be easily caused, resulting in easily forming a resist pattern in a good shape.

In the first pattern formation method, an aqueous solution used for removing the barrier film may be an aqueous solution having hydrogen ion concentration exponent (pH) sufficient for dissolving the barrier film. For example, a developer or a diluted developer may be used. With respect to the degree of dilution of the diluted developer, the concentration is lower than that of a general developer, i.e., a 2.38 wt % tetramethylammonium hydroxide aqueous solution, and is preferably, for example, not less than 0.001% and not more than 2%, which does not limit the invention.

Each of the first through third pattern formation methods preferably further includes, between the step of forming an alkali-soluble first barrier film and the step of forming an alkali-insoluble second barrier film, a step of subjecting the first barrier film to a thermal treatment.

Each of the first through third pattern formation methods preferably further includes, between the step of forming an alkali-insoluble second barrier film and the step of performing pattern exposure, a step of subjecting the first barrier film and the second barrier film to a thermal treatment.

When the first barrier film and the second barrier film are individually or simultaneously baked in this manner, the denseness of the first barrier film and the second barrier film is improved, and hence, the insolubility in the liquid provided thereon in the exposure is increased. However, when the denseness of the barrier film is increased too much, the removability of the barrier film is lowered, and therefore, it is preferably baked at a temperature in an appropriate range. For example, the temperature is preferably not less than 100° C. and not more than 150° C., which does not limit the invention.

In each of the first through third pattern formation methods, the first barrier film may include an alcohol solvent.

In this case, the alcohol solvent may be ethanol, isopropyl alcohol, n-propyl alcohol, t-butyl alcohol, sec-butyl alcohol or n-butyl alcohol.

In each of the first through third pattern formation methods, the second barrier film is preferably soluble in a fluorine solvent.

In this case, the fluorine solvent may be 1,1,2,3,3,3-hexafluoro-1-diethylaminopropane or triethylamine tris-hydrofluoride.

In each of the first through third pattern formation methods, the liquid may be water or an acidic solution.

In this case, the acidic solution may be a cesium sulfate ($Cs_2SO_4$) aqueous solution or a phosphoric acid ($H_3PO_4$) aqueous solution.

In each of the first through third pattern formation methods, the exposing light may be KrF excimer laser, $Xe_2$ laser, ArF excimer laser, $F_2$ laser, KrAr laser or $Ar_2$ laser.

DETAILED DESCRIPTION OF THE INVENTION

Embodiment 1

A pattern formation method according to Embodiment 1 of the invention will now be described with reference to FIGS. 1A through 1D, 2A through 2C, 3A and 3B.

Figure 1A:
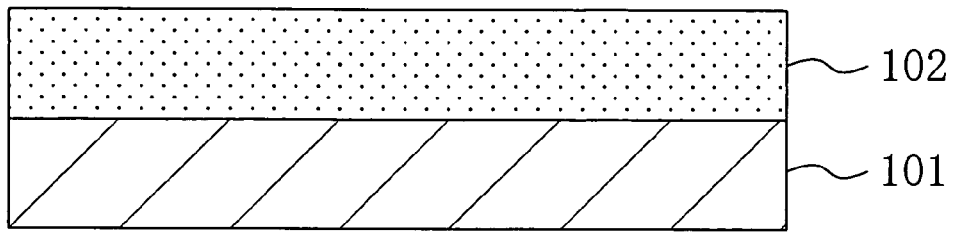
FIGS. 1A, 1B, 1C and 1D are cross-sectional views for showing procedures in a pattern formation method according to Embodiment 1 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.04 g Quencher: triethanolamine . . . 0.002 g Solvent: propylene glycol monomethyl ether acetate . . . 20 g Next, as shown in FIG. 1A, the aforementioned chemically amplified resist material is applied on a substrate 101 so as to form a resist film 102 with a thickness of 0.35 µm.

Figure 1B:
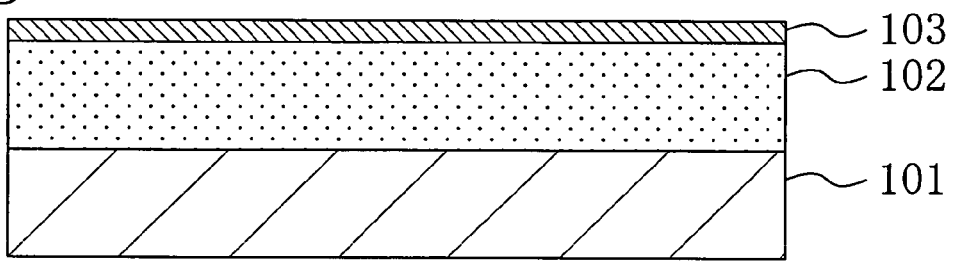

Then, as shown in FIG. 1B, by using an alkali-soluble first barrier film material having the following composition, a first barrier film 103 having a thickness of 50 nm is formed on the resist film 102 by, for example, spin coating:

Base polymer: polyacrylic acid . . . 1 g

Solvent: n-butyl alcohol . . . 25 g

Figure 1C:
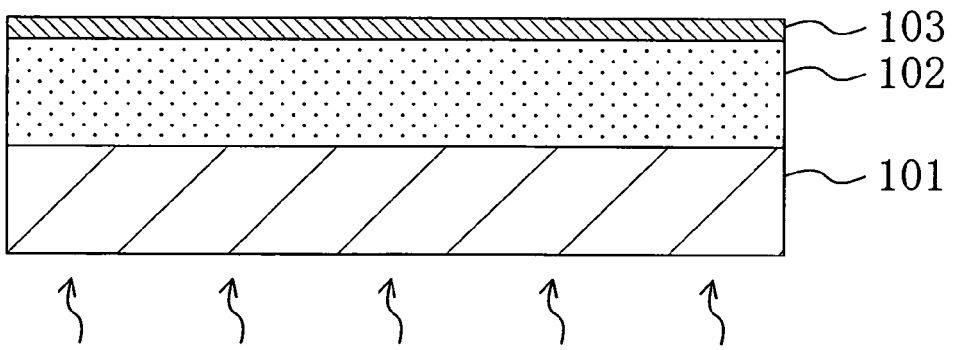

Next, as shown in FIG. 1C, the first barrier film 103 is baked with a hot plate at a temperature of 100° C. for 60 seconds, so as to improve the denseness of the first barrier film 103.

Figure 1D:
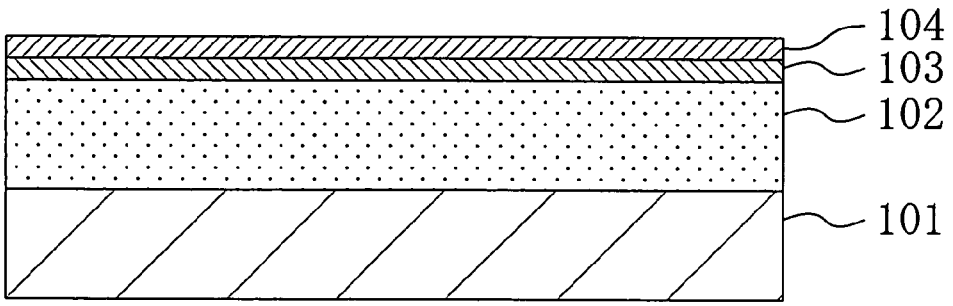

Then, as shown in FIG. 1D, by using a second barrier film material that has the following composition and is insoluble in alkali but soluble in a fluorine solvent, a second barrier film 104 having a thickness of 60 nm is formed on the first barrier film 103 by, for example, the spin coating:

Base polymer: polyvinyl hexafluoroisopropyl alcohol . . . 1 g

Solvent: n-perfluorohexane . . . 20 g

Figure 2A:
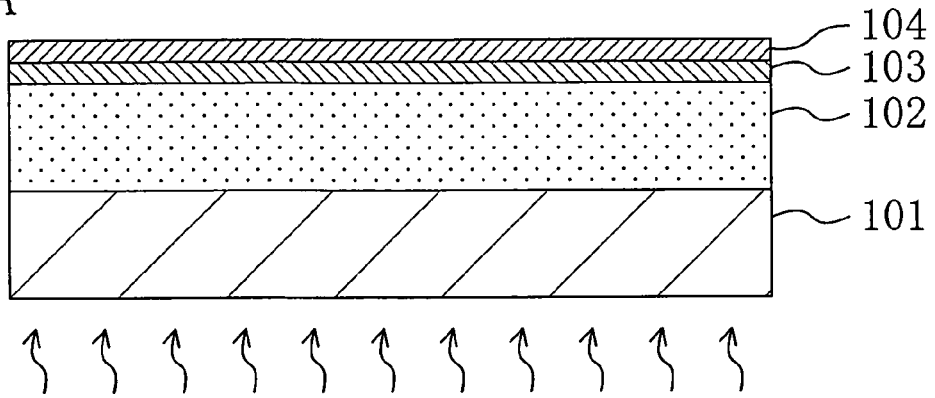
FIGS. 2A, 2B and 2C are cross-sectional views for showing other procedures in the pattern formation method of Embodiment 1.

Then, as shown in FIG. 2A, the first barrier film 103 and the second barrier film 104 thus formed are baked with a hot plate at a temperature of 110° C. for 60 seconds, so as to improve the denseness of the first barrier film 103 and the second barrier film 104.

Figure 2B:
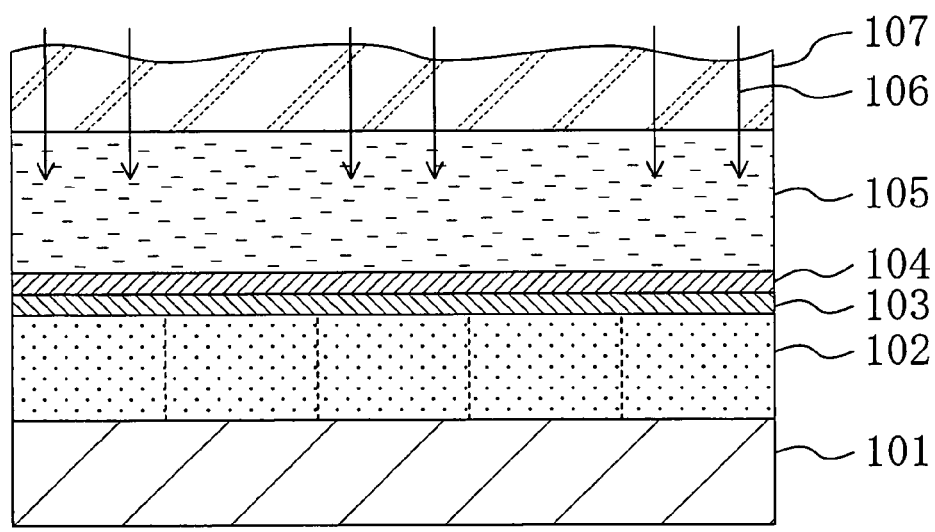

Next, as shown in FIG. 2B, with an immersion liquid 105 of water provided between the second barrier film 104 and a projection lens 107 by, for example, a puddle method, pattern exposure is carried out by irradiating the resist film 102 through the liquid 105, the second barrier film 104 and the first barrier film 103 with exposing light 106 of ArF excimer laser with NA of 0.68 having passed through a mask (not shown).

Figure 2C:
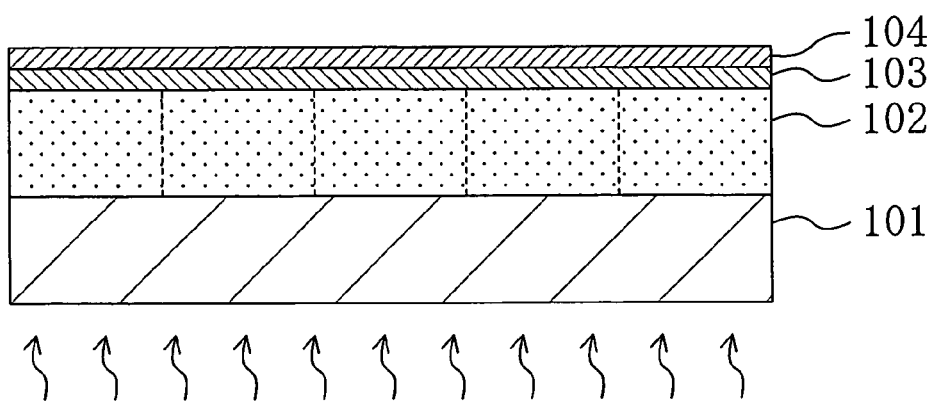

After the pattern exposure, as shown in FIG. 2C, the resist film 102 is baked with a hot plate at a temperature of 105° C. for 60 seconds (post exposure bake).

Figure 3A:
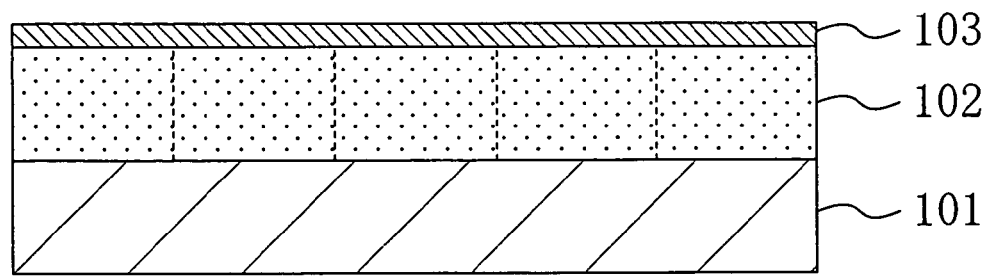
FIGS. 3A and 3B are cross-sectional views for showing other procedures in the pattern formation method of Embodiment 1.

Next, as shown in FIG. 3A, the second barrier film 104 is removed with, for example, 1,1,2,3,3,3-hexafluoro-1-diethylaminopropane, that is, a fluorine solvent.

Figure 3B:
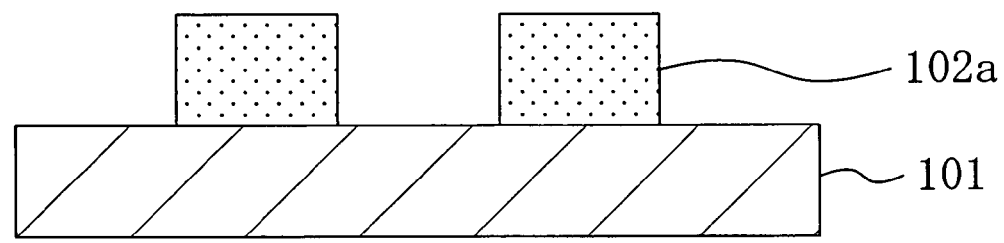

Thereafter, the first barrier film 103 is removed and the resultant resist film 102 is developed with a 2.38 wt % tetramethylammonium hydroxide developer. Thus, a resist pattern 102a made of an unexposed portion of the resist film 102 and having a line width of 0.09 μm is formed in a good shape as shown in FIG. 3B.

In this manner, according to Embodiment 1, the alkali-insoluble second barrier film 104 is formed on the alkali-soluble first barrier film 103. Since the alkali-insoluble second barrier film 104 is minimally dissolved also in the liquid 105 of water, the barrier property of the first barrier film 103 against the liquid 105 is improved in the pattern exposure. Therefore, permeation of the liquid 105 into the resist film 102 and elution of a resist component into the liquid 105 are prevented, and hence, the desired characteristics of the resist film 102 are kept, so as to form the resist pattern 102a in a good shape.

Embodiment 2

A pattern formation method according to Embodiment 2 of the invention will now be described with reference to FIGS. 4A through 4D, 5A through 5C, 6A and 6B.

Figure 4A:
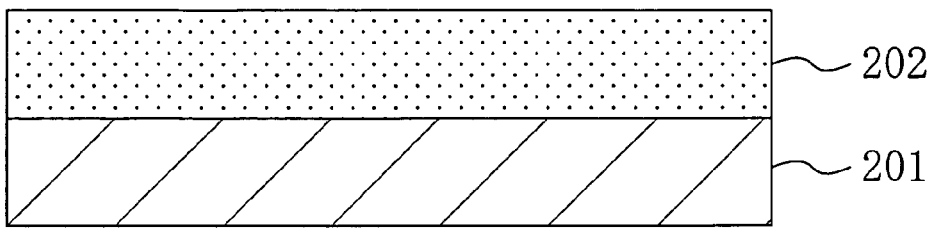
FIGS. 4A, 4B, 4C and 4D are cross-sectional views for showing procedures in a pattern formation method according to Embodiment 2 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.04 g Quencher: triethanolamine . . . 0.002 g Solvent: propylene glycol monomethyl ether acetate . . . 20 g Next, as shown in FIG. 4A, the aforementioned chemically amplified resist material is applied on a substrate 201 so as to form a resist film 202 with a thickness of 0.35 μm.

Figure 4B:
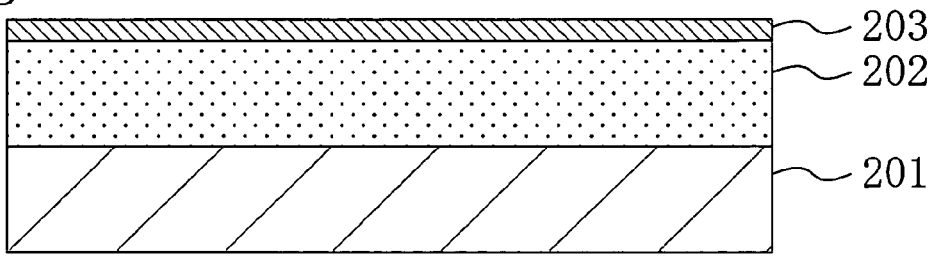

Then, as shown in FIG. 4B, by using an alkali-soluble first barrier film material having the following composition, a first barrier film 203 having a thickness of 70 nm is formed on the resist film 202 by, for example, the spin coating:

Base polymer: polyvinyl pyrrolidone . . . 1 g

Solvent: t-butyl alcohol . . . 20 g

Figure 4C:
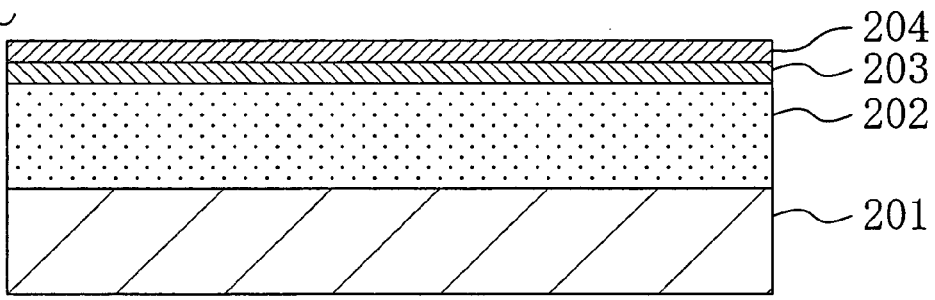

Next, as shown in FIG. 4C, by using a second barrier film material that has the following composition and is insoluble in alkali but soluble in a fluorine solvent, a second barrier film 204 having a thickness of 30 nm is formed on the first barrier film 203 by, for example, the spin coating:

Base polymer: polyvinyl hexafluoroisopropyl alcohol . . . 1 g

Solvent: n-perfluoropentane . . . 20 g

Figure 4D:
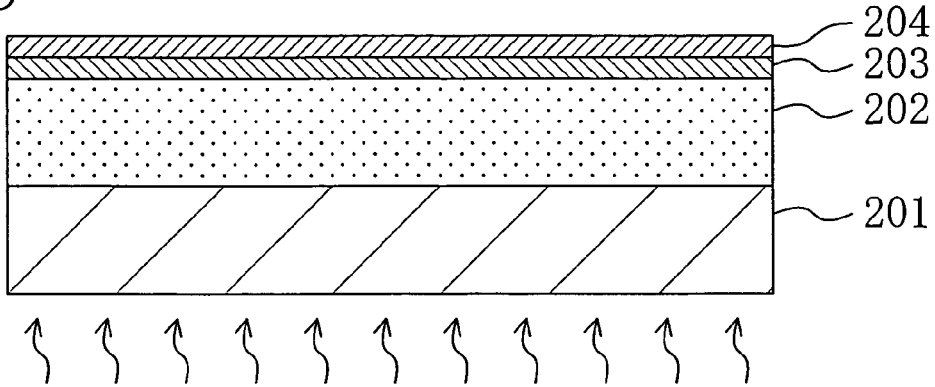

Then, as shown in FIG. 4D, the first barrier film 203 and the second barrier film 204 thus formed are baked with a hot plate at a temperature of 110° C. for 60 seconds, so as to improve the denseness of the first barrier film 203 and the second barrier film 204.

Figure 5A:
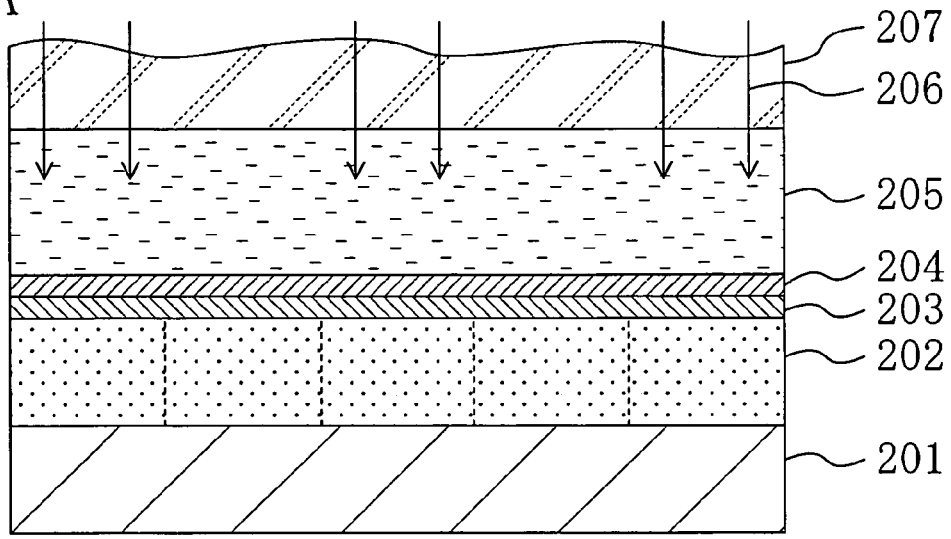
FIGS. 5A, 5B and 5C are cross-sectional views for showing other procedures in the pattern formation method of Embodiment 2.

Next, as shown in FIG. 5A, with an immersion liquid 205 of water provided between the second barrier film 204 and a projection lens 207 by, for example, the puddle method, pattern exposure is carried out by irradiating the resist film 202 through the liquid 205, the second barrier film 204 and the first barrier film 203 with exposing light 206 of ArF excimer laser with NA of 0.68 having passed through a mask (not shown).

Figure 5B:
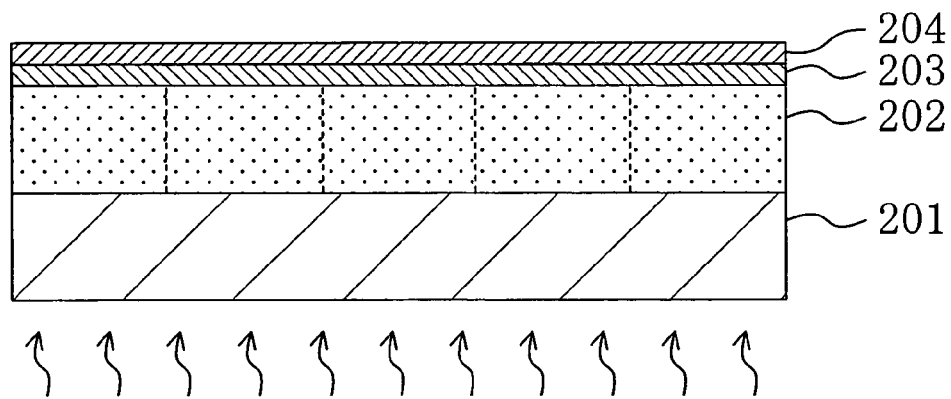

After the pattern exposure, as shown in FIG. 5B, the resist film 202 is baked with a hot plate at a temperature of 105° C. for 60 seconds (post exposure bake).

Figure 5C:
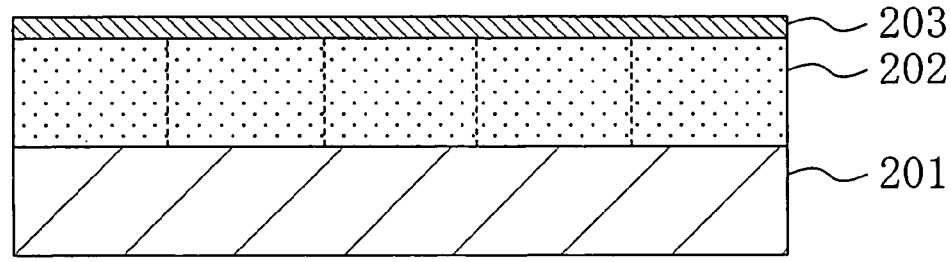

Next, as shown in FIG. 5C, the second barrier film 204 is removed with, for example, triethylamine tris-hydrofluoride, that is, a fluorine solvent.

Figure 6A:
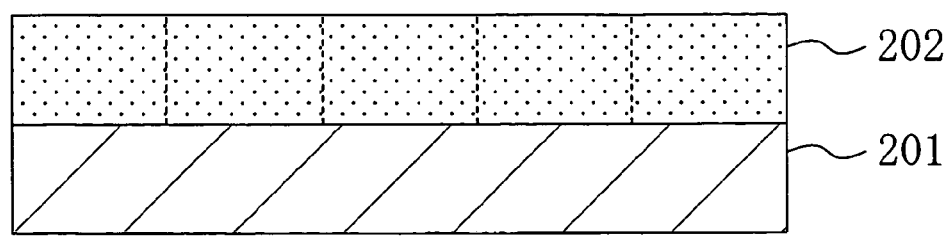
FIGS. 6A and 6B are cross-sectional views for showing other procedures in the pattern formation method of Embodiment 2.

Thereafter, as shown in FIG. 6A, the first barrier film 203 is removed with, for example, a 0.005 wt % tetramethylammonium hydroxide aqueous solution (diluted alkaline developer).

Figure 6B:
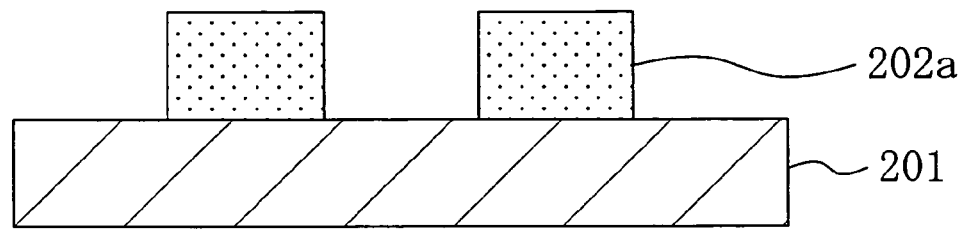

Next, the resultant resist film 202 is developed with a 2.38 wt % tetramethylammonium hydroxide developer. Thus, a resist pattern 202a made of an unexposed portion of the resist film 202 and having a line width of 0.09 μm is formed in a good shape as shown in FIG. 6B.

In this manner, according to Embodiment 2, the alkali-insoluble second barrier film 204 is formed on the alkali-soluble first barrier film 203. Since the alkali-insoluble second barrier film 204 is minimally dissolved also in the liquid 205 of water, the barrier property of the first barrier film 203 against the liquid 205 is improved in the pattern exposure. Therefore, the permeation of the liquid 205 into the resist film 202 and the elution of a resist component into the liquid 205 are prevented, and hence, the desired characteristics of the resist film 202 are kept, so as to form the resist pattern 202a in a good shape.

Embodiment 3

A pattern formation method according to Embodiment 3 of the invention will now be described with reference to FIGS. 7A through 7D and 8A through 8D.

Figure 7A:
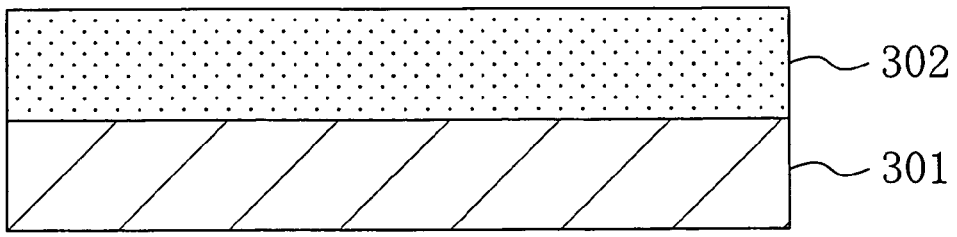
FIGS. 7A, 7B, 7C and 7D are cross-sectional views for showing procedures in a pattern formation method according to Embodiment 3 of the invention.

First, a positive chemically amplified resist material having the following composition is prepared:

Base polymer: poly((norbornene-5-methylene-t-butylcarboxylate) (50 mol %)-(maleic anhydride) (50 mol %)) . . . 2 g Acid generator: triphenylsulfonium trifluoromethane sulfonate . . . 0.04 g Quencher: triethanolamine . . . 0.002 g Solvent: propylene glycol monomethyl ether acetate . . . 20 g Next, as shown in FIG. 7A, the aforementioned chemically amplified resist material is applied on a substrate 301 so as to form a resist film 302 with a thickness of 0.35 μm.

Figure 7B:
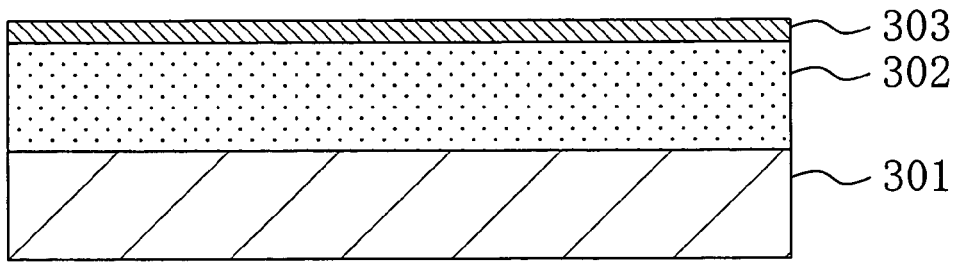

Then, as shown in FIG. 7B, by using an alkali-soluble first barrier film material having the following composition, a first barrier film 303 having a thickness of 50 nm is formed on the resist film 302 by, for example, the spin coating:

Base polymer: polyvinyl pyrrolidone . . . 1 g

Solvent: sec-butyl alcohol . . . 20 g

Figure 7C:
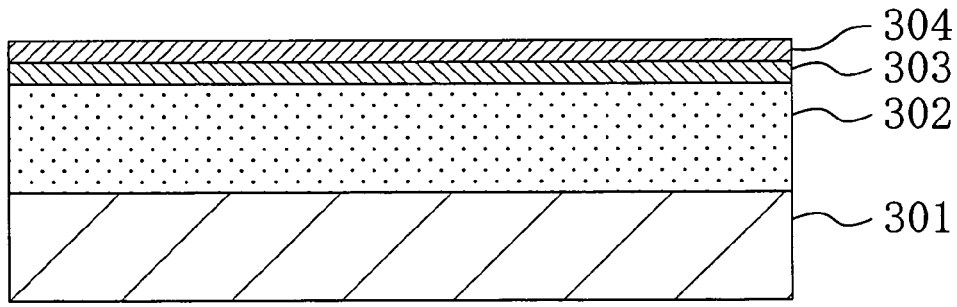

Next, as shown in FIG. 7C, by using an alkali-insoluble second barrier film material having the following composition, a second barrier film 304 having a thickness of 60 nm is formed on the first barrier film 303 by, for example, the spin coating:

Base polymer: polyvinyl hexafluoroisopropyl alcohol . . . 1 g

Solvent: sec-perfluoropentane . . . 20 g

Figure 7D:
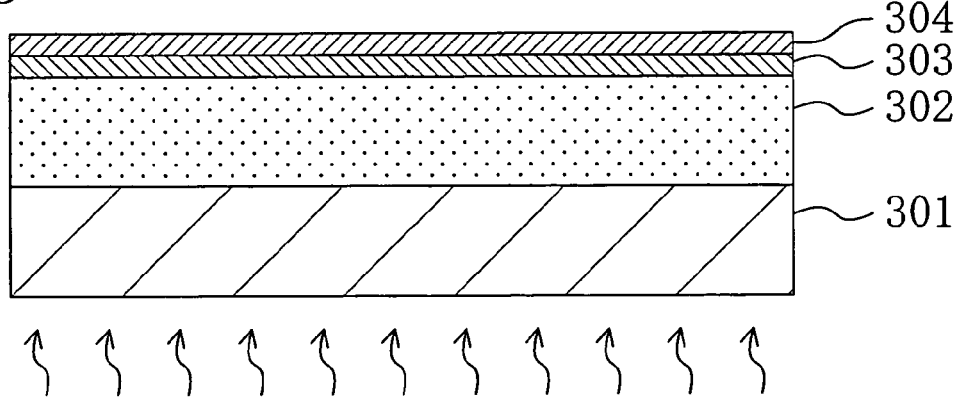

Then, as shown in FIG. 7D, the first barrier film 303 and the second barrier film 304 thus formed are baked with a hot plate at a temperature of 110° C. for 60 seconds, so as to improve the denseness of the first barrier film 303 and the second barrier film 304.

Figure 8A:
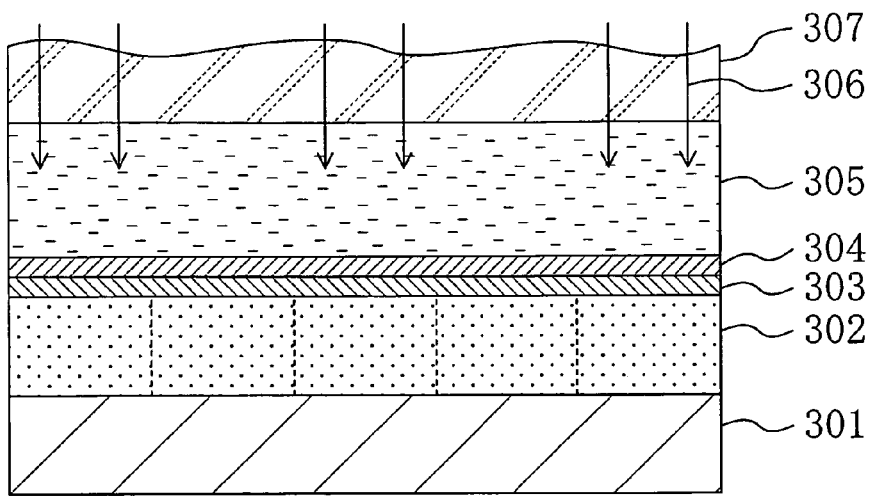
FIGS. 8A, 8B, 8C and 8D are cross-sectional views for showing other procedures in the pattern formation method of Embodiment 3.

Next, as shown in FIG. 8A, with an immersion liquid 305 of water provided between the second barrier film 304 and a projection lens 307 by, for example, the puddle method, pattern exposure is carried out by irradiating the resist film 302 through the liquid 305, the second barrier film 304 and the first barrier film 303 with exposing light 306 of ArF excimer laser with NA of 0.68 having passed through a mask (not shown).

Figure 8B:
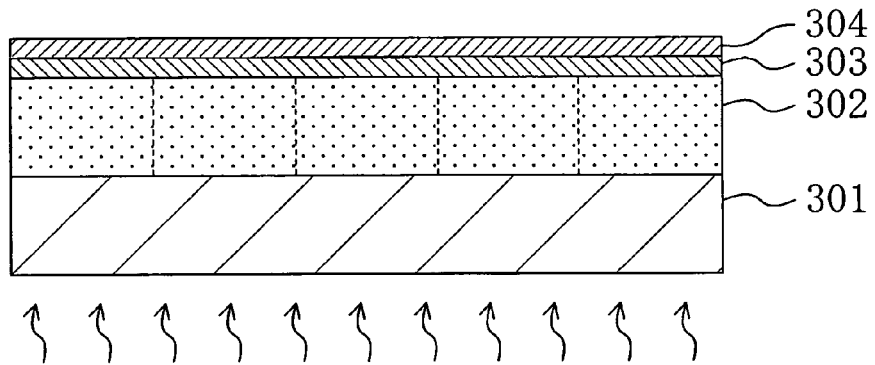

After the pattern exposure, as shown in FIG. 8B, the resist film 302 is baked with a hot plate at a temperature of 105° C. for 60 seconds (post exposure bake).

Figure 8C:
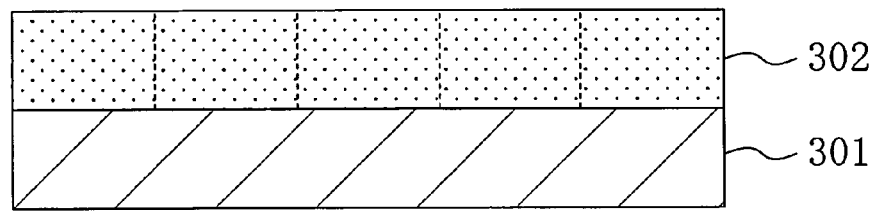

Next, as shown in FIG. 8C, the second barrier film 304 and the first barrier film 303 are removed with, for example, a 0.005 wt % tetramethylammonium hydroxide aqueous solution (diluted alkaline developer).

Figure 8D:
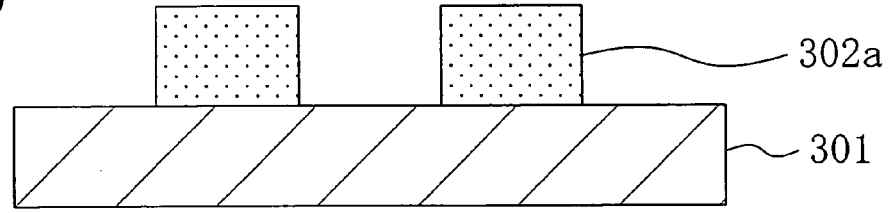
Figure 9A:
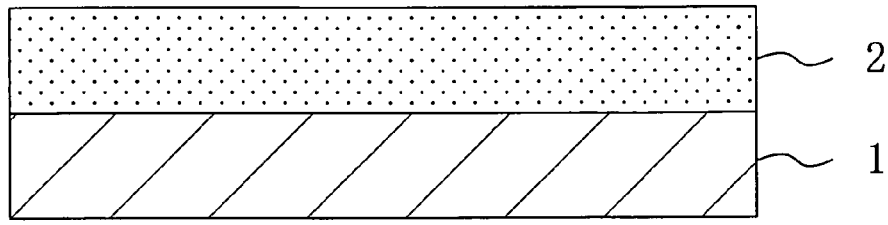
FIGS. 9A, 9B, 9C and 9D are cross-sectional views for showing procedures in a conventional pattern formation method.
Figure 9B:
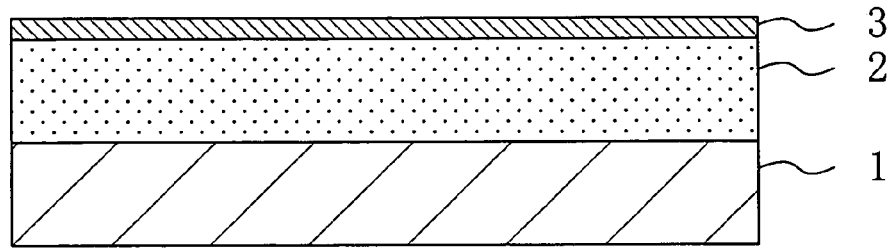
Figure 9C:
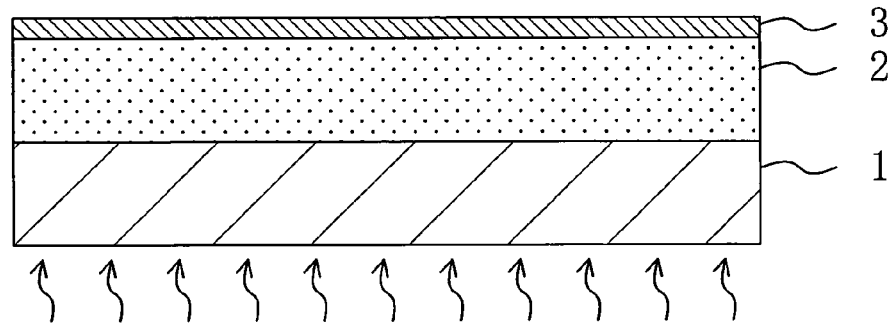
Figure 9D:
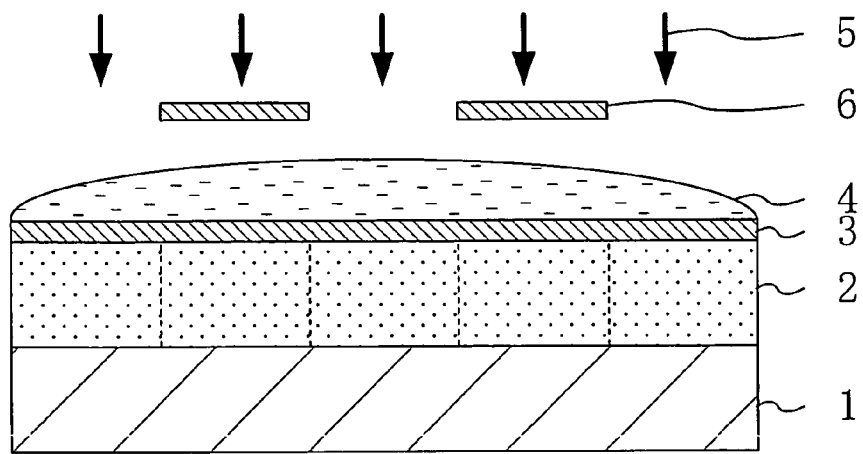
Figure 10A:
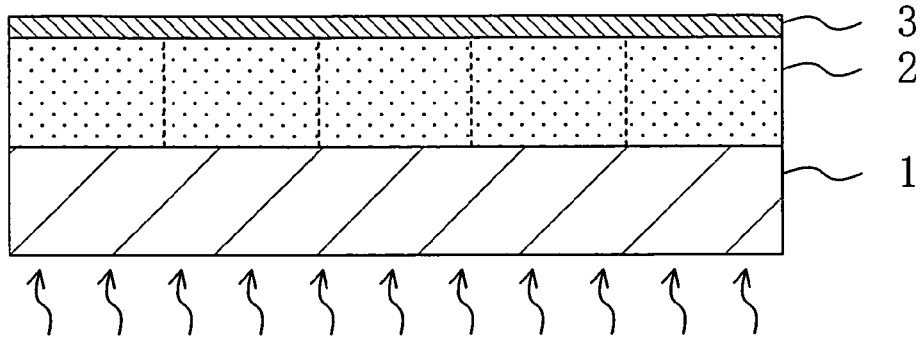
FIGS. 10A and 10B are cross-sectional views for showing other procedures in the conventional pattern formation method.
Figure 10B:
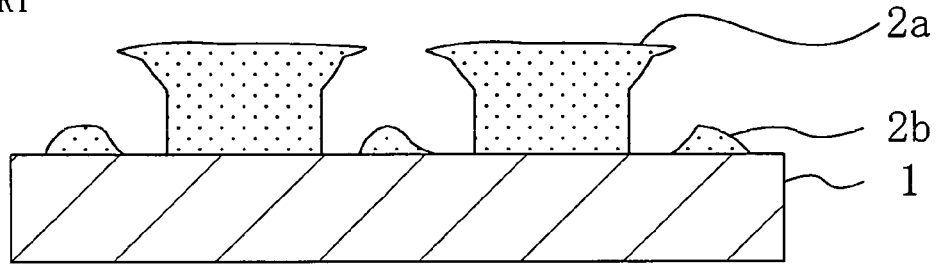
Figure 11:
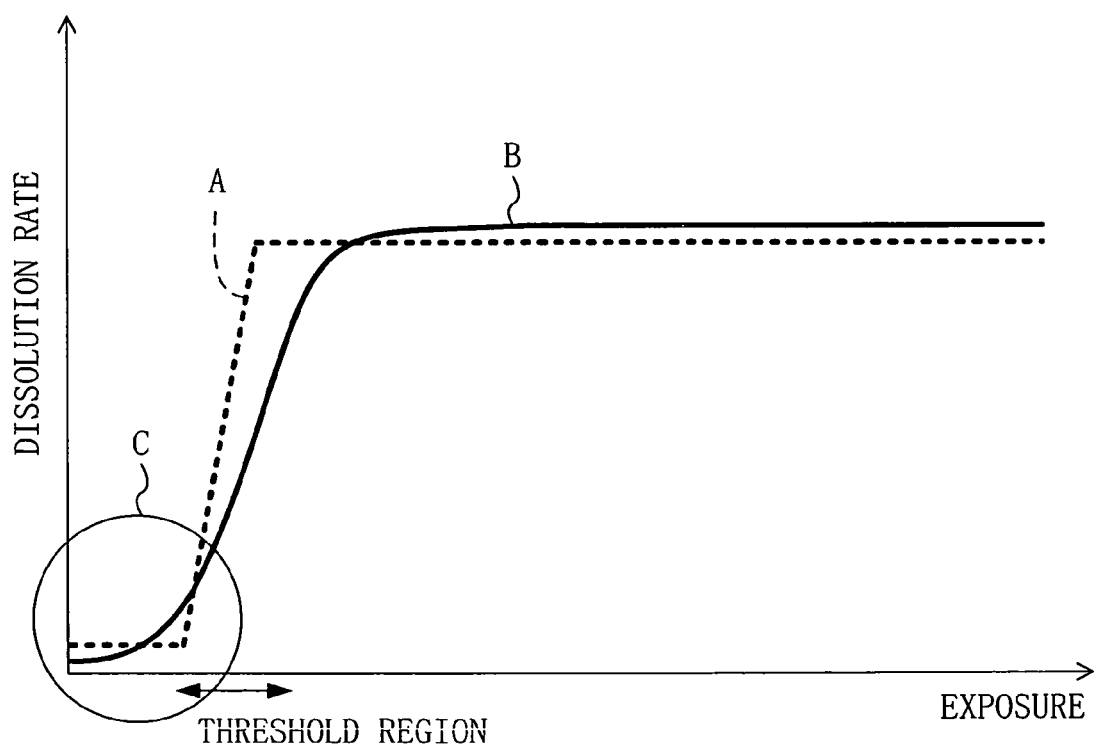
FIG. 11 is a graph for explaining control of solubility of a resist in the pattern formation method of this invention.

Thereafter, the resultant resist film 302 is developed with a 2.38 wt % tetramethylammonium hydroxide developer. Thus, a resist pattern 302a made of an unexposed portion of the resist film 302 and having a line width of 0.09 μm is formed in a good shape as shown in FIG. 8D.

In this manner, according to Embodiment 3, the alkali-insoluble second barrier film 304 is formed on the alkali-soluble first barrier film 303. Since the alkali-insoluble second barrier film 304 is minimally dissolved also in the liquid 305 of water, the barrier property of the first barrier film 303 against the liquid 305 is improved in the pattern exposure. Therefore, the permeation of the liquid 305 into the resist film 302 and the elution of a resist component into the liquid 305 are prevented, and hence, the desired characteristics of the resist film 302 are kept, so as to form the resist pattern 302a in a good shape.

In addition, in removing the first barrier film 303 with the diluted alkaline developer in Embodiment 3, the alkali-insoluble second barrier film 304 can be also easily removed owing to a function similar to the lift-off function of the first barrier film 303.

In each of Embodiments 1 through 3, the thicknesses of the first barrier film and the second barrier film are preferably approximately 30 nm through 70 nm as described in each embodiment. However, the thicknesses are not limited to this range but the lower limit of the thickness of each barrier film is a thickness capable of preventing a component of the resist film from eluting into the liquid or preventing the liquid from permeating into the resist film, and the upper limit of the thickness is a thickness that does not prevent transmission of the exposing light and can be easily removed. The thickness is, for example, not less than 10 nm and not more than approximately 100 nm depending upon the composition of the barrier film.

Furthermore, the first barrier film and the second barrier film are subjected to the thermal treatment respectively after their formation in Embodiment 1 and the thermal treatment is performed all at once after forming the second barrier film in Embodiments 2 and 3. Such a thermal treatment of the barrier films is not always necessary but may be appropriately performed depending upon the compositions, the thicknesses and the like of the barrier films.

Although water is used as the immersion liquid in each embodiment, an aqueous solution of cesium sulfate ($Cs_2SO_4$) or phosphoric acid ($H_3PO_4$) may be used for increasing the refractive index of the liquid. Furthermore, a surface active agent may be added to the liquid.

Although the exposing light is ArF excimer laser in each embodiment, the exposing light is not limited to it but may be KrF excimer laser, $Xe_2$ laser, $F_2$ laser, KrAr laser or $Ar_2$ laser instead.

Furthermore, the puddle method is employed for providing the liquid onto the second barrier film in each embodiment, which does not limit the invention, and for example, a dip method in which the whole substrate is dipped in the liquid may be employed instead.

Moreover, although a positive chemically amplified resist is used for forming the resist film in each embodiment, the present invention is applicable also to a negative chemically amplified resist. Furthermore, the invention is applicable not only to a chemically amplified resist but also to a general resist.

As described so far, according to the pattern formation method of this invention, the barrier property of a barrier film provided between a resist film and an immersion liquid is improved, so as to form a fine pattern in a good shape, and the invention is useful for, for example, a pattern formation method employed in fabrication process or the like for semiconductor devices.

What is claimed is:

1. A pattern formation method comprising the steps of:
    forming a resist film on a substrate;
    forming an alkali-soluble first barrier film on said resist film using a first barrier film material;
    forming an alkali-insoluble second barrier film on said first barrier film using a second barrier film material;
    performing pattern exposure by selectively irradiating said resist film with exposing light through said second barrier film and said first barrier film with a liquid provided on said second barrier film;
    removing said second barrier film; and
    removing said first barrier film and forming a resist pattern made of said resist film by developing said resist film after the pattern exposure,
    wherein said second barrier film material contains a different base polymer from said first barrier film material.

2. The pattern formation method of claim 1, further comprising, between the step of forming an alkali-soluble first barrier film and the step of forming an alkali-insoluble second barrier film, a step of subjecting said first barrier film to a thermal treatment.

3. The pattern formation method of claim 1, further comprising, between the step of forming an alkali-insoluble second barrier film and the step of performing pattern exposure, a step of subjecting said first barrier film and said second barrier film to a thermal treatment.

4. The pattern formation method of claim 1,
    wherein said exposing light is KrF excimer laser, $Xe_2$ laser, ArF excimer laser, $F_2$ laser, KrAr laser or $Ar_2$ laser.

5. A pattern formation method comprising the steps of:
    forming a resist film on a substrate;
    forming an alkali-soluble first barrier film on said resist film;
    forming an alkali-insoluble second barrier film on said first barrier film;
    performing pattern exposure by selectively irradiating said resist film with exposing light through said second barrier film and said first barrier film with a liquid provided on said second barrier film;
    removing said second barrier film; and
    removing said first barrier film and forming a resist pattern made of said resist film by developing said resist film after the pattern exposure
    wherein said first barrier film includes an alcohol solvent.

6. The pattern formation method of claim 5,
    wherein said alcohol solvent is ethanol, isopropyl alcohol, n-propyl alcohol, t-butyl alcohol, sec-butyl alcohol or n-butyl alcohol.

7. The pattern formation method of claim 1,
    wherein said second barrier film is soluble in a fluorine solvent.

8. The pattern formation method of claim 7,
wherein said fluorine solvent is 1,1,2,3,3,3-hexafluoro-1-diethylaminopropane or triethylamine tris-hydrofluoride.
9. The pattern formation method of claim 1,
wherein said liquid is water or an acidic solution.
10. The pattern formation method of claim 9,
wherein said acidic solution is a cesium sulfate aqueous solution or a phosphoric acid aqueous solution.
11. A pattern formation method comprising the steps of:
forming a resist film on a substrate;
forming an alkali-soluble first barrier film on said resist film using first barrier film material;
forming an alkali-insoluble second barrier film on said first barrier film using a second barrier film material;
performing pattern exposure by selectively irradiating said resist film with exposing light through said second barrier film and said first barrier film with a liquid provided on said second barrier film;
removing said second barrier film;
removing said first barrier film; and
forming a resist pattern made of said resist film by developing said resist film after the pattern exposure and after removing said first barrier film,
wherein said second barrier film material contains a different base polymer from said first barrier film material.
12. The pattern formation method of claim 11, further comprising, between the step of forming an alkali-soluble first barrier film and the step of forming an alkali-insoluble second barrier film, a step of subjecting said first barrier film to a thermal treatment.
13. The pattern formation method of claim 11, further comprising, between the step of fanning an alkali-insoluble second barrier film and the step of performing pattern exposure, a step of subjecting said first barrier film and said second barrier film to a thermal treatment.
14. The pattern formation method of claim 11,
wherein said second barrier film is soluble in a fluorine solvent.
15. The pattern formation method of claim 14,
wherein said fluorine solvent is 1,1,2,3,3,3-hexafluoro-1-diethylaminopropane or triethylamine tris-hydrofluoride.
16. The pattern formation method of claim 11,
wherein said liquid is water or an acidic solution.
17. The pattern formation method of claim 16,
wherein said acidic solution is a cesium sulfate aqueous solution or a phosphoric acid aqueous solution.
18. The pattern formation method of claim 11,
wherein said exposing light is KrF excimer laser, $Xe_2$ laser, ArF excimer laser, $F_2$ laser, KrAr laser or $Ar_2$ laser.
19. A pattern formation method comprising the steps of:
forming a resist film on a substrate;
forming an alkali-soluble first barrier film on said resist film;
forming an alkali-insoluble second barrier film on said first barrier film;
performing pattern exposure by selectively irradiating said resist film with exposing light through said second barrier film and said first barrier film with a liquid provided on said second barrier film;
removing said second barrier film;
removing said first barrier film; and
forming a resist pattern made of said resist film by developing said resist film after the pattern exposure and after removing said first barrier film,
wherein said first barrier film includes an alcohol solvent.
20. The pattern formation method of claim 19,
wherein said alcohol solvent is ethanol, isopropyl alcohol, n-propyl alcohol, t-butyl alcohol, sec-butyl alcohol or n-butyl alcohol.
21. A pattern formation method comprising the steps of:
forming a resist film on a substrate;
forming an alkali-soluble first barrier film on said resist film using a first barrier film;
forming an alkali-insoluble second barrier film on said first barrier film using a second barrier film;
performing pattern exposure by selectively irradiating said resist film with exposing light through said second barrier film and said first barrier film with a liquid provided on said second barrier film;
removing said first barrier film, thereby simultaneously removing said second barrier film; and
forming a resist pattern made of said resist film by developing said resist film after the pattern exposure,
wherein said second barrier film material contains a different base polymer from said first barrier film material.
22. The pattern formation method of claim 21, further comprising, between the step of forming an alkali-soluble first barrier film and the step of forming an alkali-insoluble second barrier film, a step of subjecting said first barrier film to a thermal treatment.
23. The pattern formation method of claim 21, further comprising, between the step of forming an alkali-insoluble second barrier film and the step of performing pattern exposure, a step of subjecting said first barrier film and said second barrier film to a thermal treatment.
24. The pattern formation method of claim 21,
wherein said first barrier film includes an alcohol solvent.
25. The pattern formation method of claim 24,
wherein said alcohol solvent is ethanol, isopropyl alcohol, n-propyl alcohol, t-butyl alcohol, sec-butyl alcohol or n-butyl alcohol.
26. The pattern formation method of claim 21,
wherein said second barrier film is soluble in a fluorine solvent.
27. The pattern formation method of claim 26,
wherein said fluorine solvent is 1,1,2,3,3,3-hexafluoro-1-diethylaminopropane or triethylamine tris-hydrofluoride.
28. The pattern formation method of claim 21,
wherein said liquid is water or an acidic solution.
29. The pattern formation method of claim 28,
wherein said acidic solution is a cesium sulfate aqueous solution or a phosphoric acid aqueous solution.
30. The pattern formation method of claim 21,
wherein said exposing light is KrF excimer laser, $Xe_2$ laser, ArF excimer laser, $F_2$ laser, KrAr laser or $Ar_2$ laser.

* * * * *

UNITED STATES PATENT AND TRADEMARK OFFICE
CERTIFICATE OF CORRECTION

PATENT NO. : 7,595,142 B2
APPLICATION NO. : 11/430993
DATED : September 29, 2009
INVENTOR(S) : Masayuki Endo et al.

It is certified that error appears in the above-identified patent and that said Letters Patent is hereby corrected as shown below:

On the title page, in Item "(56) References Cited", under "OTHER PUBLICATIONS", please change "M. SWITKES, et al. 'Immersion lithography at 157 nm,' J. Vac. Sci. Technol., Nov/Dec 2001, pp 2353-2356, Vol B 19, No. 6, American Society"

to

--M. SWITKES, et al. "Immersion lithography at 157 nm," J. Vac. Sci. Technol., Nov/Dec 2001, pp 2353-2356, Vol B 19, No. 6, American Vacuum Society--.

Signed and Sealed this

Twenty-fifth Day of May, 2010

David J. Kappos
*Director of the United States Patent and Trademark Office*